United States Patent
Rajski et al.

(10) Patent No.: US 8,499,209 B2
(45) Date of Patent: Jul. 30, 2013

(54) AT-SPEED SCAN TESTING WITH CONTROLLED SWITCHING ACTIVITY

(75) Inventors: Janusz Rajski, West Linn, OR (US); Elham K. Moghaddam, Beaverton, OR (US); Nilanjan Mukherjee, Wilsonville, OR (US); Mark A Kassab, Wilsonville, OR (US); Xijiang Lin, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 248 days.

(21) Appl. No.: 12/765,530

(22) Filed: Apr. 22, 2010

(65) Prior Publication Data

US 2010/0275077 A1     Oct. 28, 2010

Related U.S. Application Data

(60) Provisional application No. 61/171,777, filed on Apr. 22, 2009.

(51) Int. Cl.
| | |
|---|---|
| *G01R 31/28* | (2006.01) |
| *G06F 11/00* | (2006.01) |
| *G06F 9/455* | (2006.01) |
| *G06F 17/50* | (2006.01) |
| *G06F 11/22* | (2006.01) |

(52) U.S. Cl.
USPC ............ 714/741; 716/111; 716/112; 716/136

(58) Field of Classification Search
None
See application file for complete search history.

(56) References Cited

U.S. PATENT DOCUMENTS

| | | | | |
|---|---|---|---|---|
| 7,647,540 | B2 * | 1/2010 | Rajski et al. | 714/738 |
| 7,685,491 | B2 * | 3/2010 | Lin et al. | 714/738 |
| 7,818,644 | B2 * | 10/2010 | Rajski et al. | 714/732 |
| 2002/0053057 | A1 * | 5/2002 | Rajski et al. | 714/738 |
| 2003/0131298 | A1 * | 7/2003 | Rajski et al. | 714/738 |
| 2005/0240887 | A1 * | 10/2005 | Rajski et al. | 716/4 |
| 2007/0016836 | A1 * | 1/2007 | Rajski et al. | 714/728 |
| 2007/0234163 | A1 * | 10/2007 | Mukherjee et al. | 714/736 |
| 2007/0234169 | A1 * | 10/2007 | Rajski et al. | 714/742 |
| 2007/0250749 | A1 * | 10/2007 | Lin et al. | 714/738 |
| 2008/0052578 | A1 * | 2/2008 | Rajski et al. | 714/729 |
| 2008/0052586 | A1 * | 2/2008 | Rajski et al. | 714/741 |
| 2009/0259898 | A1 * | 10/2009 | Wen et al. | 714/726 |
| 2009/0319842 | A1 * | 12/2009 | Wen et al. | 714/738 |

OTHER PUBLICATIONS

I.Pomeranze and S. M. Reddy, "Definition and Generation of Partially-functional Broadside Tests", IET Computer and Digit. Jan. 2009, pp. 1-13.

X. Wen, et al, "Low-capture-power test generation for scan-based at-speed testing," Proc. ITC 2005, pp. 1019-1028.

S. Remersaro, et al, "Preferred Fill: A Scalable Method to Reduce Capture Power for Scan Based Designs," in Proc. of Intl. Test Conf., Oct. 2006, pp. 1-10.

S. Remersaro, et al, "Low Shift and Capture Power Scan Tests," Proc. VLSI Design Conf., Jan. 2007, pp. 793-798.

(Continued)

*Primary Examiner* — Guerrier Merant

(57) ABSTRACT

Test patterns for at-speed scan tests are generated by filling unspecified bits of test cubes with functional background data. Functional background data are scan cell values observed when switching activity of the circuit under test is near a steady state. Hardware implementations in EDT (embedded deterministic test) environment are also disclosed.

23 Claims, 12 Drawing Sheets

OTHER PUBLICATIONS

X. Wen, et al, "A New ATPG Method for Efficient Capture Power Reduction During Scan Test," Proc. VLSI Test Symp., pp. 58-63, 2006.

B. Benware, C. Schuermyer, N. Tamarapalli, Kun-Han Tsai, S. Ranganthan, R. Madge, J. Rajski and P. Krishnamurthy, "Impact of multiple-detect test patterns on product quality", Proc. ITC 2003, pp. 1031-1040.

B. Koenemann, "LFSR-coded test patterns for scan designs," in Proc. Eur. Test Conf., 1991, pp. 237-242.

J. Rajski, et al., "Embedded deterministic test for low cost manufacturing test," Proc. ITC, pp. 301-310, 2002.

C.V. Krishna and N. A. Touba, "Reducing test data volume using LFSR reseeding with seed compression," in Proc. ITC, 2002, pp. 321-330.

F. Hsu, K. Butler, and J. Patel, "A case study on the implementation of the Illinois scan architecture," in Proc. ITC, 2001, pp. 538-547.

A Chandra and K. Chakrabarty, "Frequency-directed run-length (FDR) codes with application to system-on-a-chip test data compression," in Proc. VLSI Test Symp., 2001, pp. 42-47.

Mrugalski, N. Mukherjee, J. Rajski, D. Czysz, J. Tyszer, "Compression Based on Deterministic Vector Clustering of Incompatible Test Cubes", Proc ITC paper 9.2, 2009.

J. Saxena, K. M. Butler, V. B. Jayaram, et.al., "A Case Study of IR-drop in Structured At-Speed Testing", Proc ITC 2003, pp. 1098-1104.

G Y. Bonhomme, P. Girard, C. Landrault, and S. Pravossoudovitch, "Power driven chaining of flip-flops in scan architecture," Proc. ITC, pp. 796-803, 2002.

V. Dabholkar, S. Chakravarty, I. Pomeranz and S. M. Reddy, "Techniques for minimizing power dissipation in scan and combinational circuits during test application", IEEE Trans. CAD, vol. 17, pp. 1325-1333, Dec.

J. Saxena, K. B. Butler, and L. Whetsel, "An analysis of power reduction techniques in scan testing," Proc. ITC, pp. 670-677, 2001.

L. Whetsel, "Adapting scan architectures for low power operation," Proc. ITC, 2000, pp. 863-872.

M. Chiu and J. C.-M. Li, "Jump scan: a DFT technique for low power testing," Proc. VTS, pp. 277-282, 2005.

T.-C. Huang and K.-J. Lee, "A token scan architecture for low power testing," Proc. ITC, pp. 660-669, 2001.

O. Sinanoglu, I. Bayraktaroglu, and A. Orailoglu, "Test power reduction through minimization of scan chain transitions," Proc. VTS, pp. 166-171, 2002.

Y. Bonhomme, P. Girard, L. Guiller, C. Landrault, and S. Pravossoudovitch, "A gated clock scheme for low power scan testing of logic ICs or embedded cores," Proc. ATS, pp. 253-258, 2001.

W. Li, S. M. Reddy, I. Pomeranz, "On Reducing Peak Current and Power during Test" ISVLSI, p. 156-161, 2005.

X. Wen, et al. "A novel scheme to reduce power supply noise for high-quality at-speed scan testing," in Proc. Int. Test Conf., 2007, pp. 25.1.1-25.1.10.

Elham K. Moghaddam, Janusz Rajski, Sudhakar M. Reddy, Mark Kassab, "At-Speed Scan Test with Low Switching Activity," VTS 2010 Symp. In press.

P. M. Rosinger, B. M. Al-Hashimi, and N. Nicolici, "Low power mixed-mode BIST based on mask pattern generation using dual LFSR re-seeding," Proc. ICCD, pp. 474-479, 2002.

J. Lee and N. A. Touba, "Low power test data compression based on LFSR reseeding," Proc. ICCD, pp. 180-185, 2004.

D. Czysz, G. Mrugalski, J. Rajski, and J. Tyszer, "Low Power Embedded Deterministic Test," VLSI Test Symp., 9 pp. (May 6-10, 2007).

D. Czysz, G. Mrugalski, J. Rajski, and J. Tyszer, "New test data decompressor for low power applications," in Proc. DAC, 2007, pp. 539-544.

D. Czysz, M. Kassab, X. Lin, G. Mrugalski, J. Rajski, and J. Tyszer. Low Power Scan Shift and Capture in the EDT Environment. In Proceedings IEEE International Test Conference (ITC), paper 13.2, 2008.

P. Girad, "Survey of Low-Power Testing of VLSI Circuits," IEEE Design & Test of Computers, vol. 19, No. 3, pp. 82-92, Mar. 2002.

R. Sankaralingam, R. Oruganti and N. Touba, "Static Compaction Techniques to Control Scan Vector Power Dissipation," in Proc. IEEE VLSI Test Symp., pp. 35-42, 2000.

X. Wen, Y. Yamashita, S. Morishima, S. Kajihara, L. Wang, K.K. Saluja, and K. Kinoshita, "Low-capture-power test generation for scan-based at-speed testing," Proc. ITC, pp. 1-10, 2005.

P. M. Rosinger, B. M. Al-Hashimi, and N. Nicolici, "Scan architecture with mutually exclusive scan segment activation for shift and capture power reduction," IEEE Trans. CAD, vol. 23, pp. 1142-1153, Jul. 2004.

Y. Bonhomme, P. Girard, L. Guiller, C. Landrault, and S. Pravossoudovitch, "Efficient scan chain design for power minimization during scan testing under routing constraint," Proc. ITC, pp. 488-493, 2003.

N. Nicolici, B.M. Al-Hashimi, and A.C. Williams, "Minimization of power dissipation during test application in full-scan sequential circuits using primary input freezing," IEE Proc. Computers Digital Techniques, vol. 147, pp. 313-322, Sep. 2000.

S. Wang and S. K. Gupta, "ATPG for heat dissipation minimization during test application," IEEE Trans. Computers, vol. 47, pp. 256-262, Feb. 1998.

S. Wang and S.K. Gupta, "An automatic test pattern generator for minimizing switching activity during scan testing activity,"IEEE Trans. CAD, vol. 21, pp. 954-968, Aug. 2002.

Howard, J.M.; Remersaro, S.; Reddy, S.M.; Pomeranz, I.; "Reduced switching activity tests for broadcast scan based designs"; LATW 2007; Mar. 11-14, 2007.

A. Chandra and K. Chakrabarty, "Low-power scan testing and test data compression for system-on-a-chip," IEEE Trans. CAD, vol. 21, pp. 597-604, May 2002.

A. Chandra and K. Chakrabarty, "A unified approach to reduce SOC test data volume, scan power and testing time,"IEEE Trans. CAD, vol. 22, pp. 352-362, Mar. 2003.

B. Benware, C. Schuermyer, S. Ranganathan, R. Madge, P. Krishnamurthy, N. Tamarapalli, K.-H. Tsai, and J. Rajski, "Impact of multiple-detect test patterns on product quality,"Proc. ITC, pp. 1031-1040, 2003.

Meng-Fan Wu, Jiun-Lang, Xiaoqing Wen, and Xiaoqing Wen, "Power Supply Noise Reduction for At-Speed Scan Testing in Linear-Decompression Environment," IEEE Trans. Computer Aided Design, vol. 28, pp. 1767-1776, Nov. 2009.

I. Pomeranze and S. M. Reddy "Functional Broadside Tests with Minimum and Maximum Switching Activity", Low Power Electronic, Dec. 2008, pp. 247-262.

I. Pomeranz, "On the Generation of Scan-based Test Sets with Reachable States for Testing under Functional Operation Conditions", Proc. DAC 2004, pp. 928-933.

I. Pomeranz and S. M. Reddy, "Generation of Functional Broadside Tests for Transition Faults", IEEE TCAD, 2005.

Z. Zhang, et al, "On Generating Pseudo-Functional Delay Fault Tests for Scan Design", Proc. DFTS 2005, pp. 398-405.

J. Rearick, "Too Much Delay Fault Coverage Is a Bad Thing", Proc. ITC, 2001, pp. 624-633.

P. M. Rosinger, et.al., "Scan Architecture with Mutually Exclusive Scan Segment Activation for Shift and Capture Power Reduction", IEEE TCAD, Jul. 2004, pp. 1142-1153.

K.-J. Lee, S.-J. Hsu and C.-M. Ho, "Test Power Reduction with Multiple Capture Orders", Proc. ATS 2004, pp. 26-31.

"A physical-location-aware X-filling method for IR-drop reduction in at-speed scan test," Wen-Wen Hsieh ; I-Sheng Lin ; TingTing Hwang.

"State-Sensitive X-Filling Scheme for Scan Capture Power Reduction," Jing-Ling Yang ; Qiang Xu.

"Critical-Path-Aware X-Filling for Effective IR-Drop Reduction in At-Speed Scan Testing," Xianoqing Wen et al.

\* cited by examiner

AT-SPEED SCAN TESTING WITH CONTROLLED SWITCHING ACTIVITY

RELATED APPLICATIONS

This application claims priority to U.S. Provisional Patent Application No. 61/171,777, entitled "A New Method To Reduce Overtesting In Scan Based Design," filed on Apr. 22, 2009, and naming Janusz Raj ski et al. as inventors, which application is incorporated entirely herein by reference.

FIELD OF THE INVENTION

The present invention is directed to scan-based tests of integrated circuits. Various aspects of the invention may be particularly useful for at-speed scan tests.

BACKGROUND OF THE INVENTION

At-speed tests, which capture a test response at the rated clock speed, have become more and more important as integrated circuits' feature sizes continue to shrink and operating frequencies continue to increase. Functional tests may be used as at-speed tests, but they are expensive due to the cost of generating the tests and the cost of high speed functional testers. Thus, relatively inexpensive scan-based tests (scan tests) are widely adopted for at-speed testing digital integrated circuits (IC). While scan tests are less costly to implement with high fault coverage, they may violate various functional constraints on the circuit under test (CUT) and cause the CUT to operate in non-functional states during a test. Here, the terms of functional/non-functional states are used interchangeably with two other pairs of terms—legal/illegal and reachable/unreachable states—to denote the states of a circuit that can/cannot be reached during the functional operation of the circuit (i.e., the typical operation of the circuit while it is performing its intended functions). For example, for a BCD counter with four scan cells, only ten of the sixteen states are legal states. For more complex circuits, a much smaller percentage of their total possible states (i.e., both functional and nonfunctional states) are functional states.

Non-functional characteristics of test stimuli and test responses in scan tests may cause high switching activity at circuit nodes during a test. High switching activity may cause two problems. The first problem is overtesting. High switching activity requires high peak supply currents and thus results in high IR (product of current and resistance) drops. High IR drops may increase signal propagation delays that would not happen in a functional state of a CUT. As such, some good IC chips may fail at-speed tests, causing false yield losses. The second problem is high power dissipation. High switching activity may cause hot spots and permanent damage on a CUT. Therefore, it is important keep the switching activity of a CUT close to the switching activity that would be produced during its functional operation (i.e., the switching activity that would be produced by its functional states) to avoid overtesting and high power dissipation.

Several methods have been proposed to reduce overtesting and IR-drop during at-speed scan tests. One method, scan chain segmentation with gated clocking, divides scan chains into several segments and enables only one scan chain segment at a time to capture test responses. This reduces the number of gates affected by the state changes of scan cells and thus the switching activity in the circuit. However, this method not only increases test pattern counts, but consumes additional chip area and requires design effort to enable independently clocking scan segments.

Another method, functional scan testing, restricts the scan-in states to the set of reachable states to insure that the CUT operates only in the functional mode during capture cycles. Identifying reachable states, however, is highly complex for large designs. The pseudo-functional scan test method determines only a subset of illegal states and generates tests that avoid using any of the subset of illegal states as scan-in states. But even finding a set of illegal states sufficiently large may still be computationally intensive, especially in designs with multiple clock domains. Both functional and pseudo-functional scan test methods may also reduce fault coverage since they avoid detection of some faults that require non-functional scan-in states.

The method of partially-functional scan testing uses scan-in states that are at a minimal Hamming distance from a reachable state. By keeping the Hamming distance of scan-in states from reachable states to a small value, the switching activity caused by a test is close to or the same as that caused by reachable states.

In addition to the methods discussed above, various methods are based upon filling unspecified bits in test cubes. These methods, also known as "X-filling" methods because unspecified bits (i.e., "X-bits") in a test cube are filled with some values, have a unique advantage over the above four methods. Specifically, X-filling may be used as a post-processing step in any conventional automated test pattern generation (ATPG) flow and thus requires no change to conventional ATPG procedures. The low-capture-power (LCP) X-filling method assigns 0s or 1s to the X-bits in a test cube to form a test pattern in a way such that the number of transitions at the outputs of scan cells is reduced in capture mode. While it is effective in reducing IR-drops, this method increases pattern counts significantly and is less scalable due to its long run time.

The preferred fill (PF) method has been discussed in S. Remersaro, et al, "Preferred Fill: A Scalable Method to Reduce Capture Power for Scan Based Designs," in Proc. of Intl. Test Conf., October 2006, pp. 1-10., which is incorporated herein by reference. The PF method attempts to reduce the Hamming distance between the initialized and captured patterns by using a procedure based on signal probabilities. This method does not need a long run time, but pattern counts are still significantly high.

The zero-fill method is also widely used, especially in test data compression procedures. This method increases the number of bits with a "0" value in a test vector, which helps reduce switching activity, especially during scan shift. Yet it also tends to increase pattern counts significantly.

While the X-filling methods reviewed above generate tests with low switching activity and power dissipation during testing, they may generate tests to detect a target fault that causes far less switching activity than in functional states, which may lead to undertesting.

A variety of hardware arrangements have been proposed to implement various scan test methods with controlled switching activity, including some of those discussed above, in EDT (embed deterministic test) environments. For example, low power test data encoding schemes adopt conventional LFSR (linear feedback shift register) reseeding techniques to reduce the scan-in transition probability. The method uses two LFSRs to produce test cubes and the corresponding mask bits. Outputs of both LFSRs are AND-ed or OR-ed to decrease the amount of switching. The use of extra seeds may compromise compression ratios, so some implementations of this method divide test cubes into blocks and only use reseeding to encode blocks that contain transitions. Other blocks are then replaced with a constant value, which is fed directly into scan chains.

The technique proposed in D. Czysz, et al., "Low Power Embedded Deterministic Test," VLSI Test Symp., 9 pp. (May 6-10, 2007), which is incorporated herein by reference, identifies self-loop (SL) states of LFSRs to apply identical data to the scan chains for a number of shift cycles, thereby reducing the total number of transitions in scan cells. This technique tries to identify each slice of the test that has a specified bit a SL state. Then the remaining slices with no specified positions inherit SL states from their most adjacent neighbors. The result is a test vector in which many neighboring slices are identical. This reduces power consumed in the circuit during shift by reducing the number of transitions in the output of the scan cells.

In D. Czysz, et al., "Low Power Scan Shift and Capture in the EDT Environment," Proceedings IEEE International Test Conference (ITC), paper 13.2, 2008, which is incorporated herein by reference, a technique is proposed to reduce power during both shift and capture periods in EDT based designs. It employs a controller that allows a given scan chain to be driven either by a power-aware EDT decompressor, or by a constant value fixed for the entire scan load. The same controller is used to decide which scan chains remain in a shift mode during the capture cycle by judiciously disabling scan clocks.

BRIEF SUMMARY OF THE INVENTION

Aspects of the invention relate to techniques of at-speed scan testing that control the switching activity of a circuit under test so that it is near or at the switching activity of a steady state. With various implementations of the invention, functional background data are used to filled unspecified bits of a test cube to generate a test pattern. Here, functional background data refer to scan cell values observed when the switching activity of a circuit is near or at a steady state. Functional background data can be generated by applying another test pattern for a plurality of clock cycles. The applied test pattern itself may be derived by filling the unspecified bits of the test cube using a conventional X-filling method, such as the random fill, zero fill and preferred fill methods. Where methods of filling unspecified bits with functional background data are applied in an EDT (Embedded Deterministic Test) environment, one or two control module may be used to determine whether scan cells receive data from a decompressed test cube or use functional background data. Functional background data can be test responses of a prior test pattern.

BRIEF DESCRIPTION OF THE DRAWINGS

FIG. 10*a* shows a portion of a test cube with specified;

FIG. 10*b* shows the corresponding control pattern according to some embodiments of the invention.

DETAILED DESCRIPTION OF THE INVENTION

Various aspects of the present invention relate to techniques of filling unspecified bits of a test cube with functional background data. In the following description, numerous details are set forth for purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or a networked computer.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "fill" to describe the disclosed methods. Such terms are high-level abstractions of the actual operations that are performed. The actual operations that correspond to these terms will vary depending on the particular implementation and are readily discernible by one of ordinary skill in the art.

Operating Environment

Figure 1:
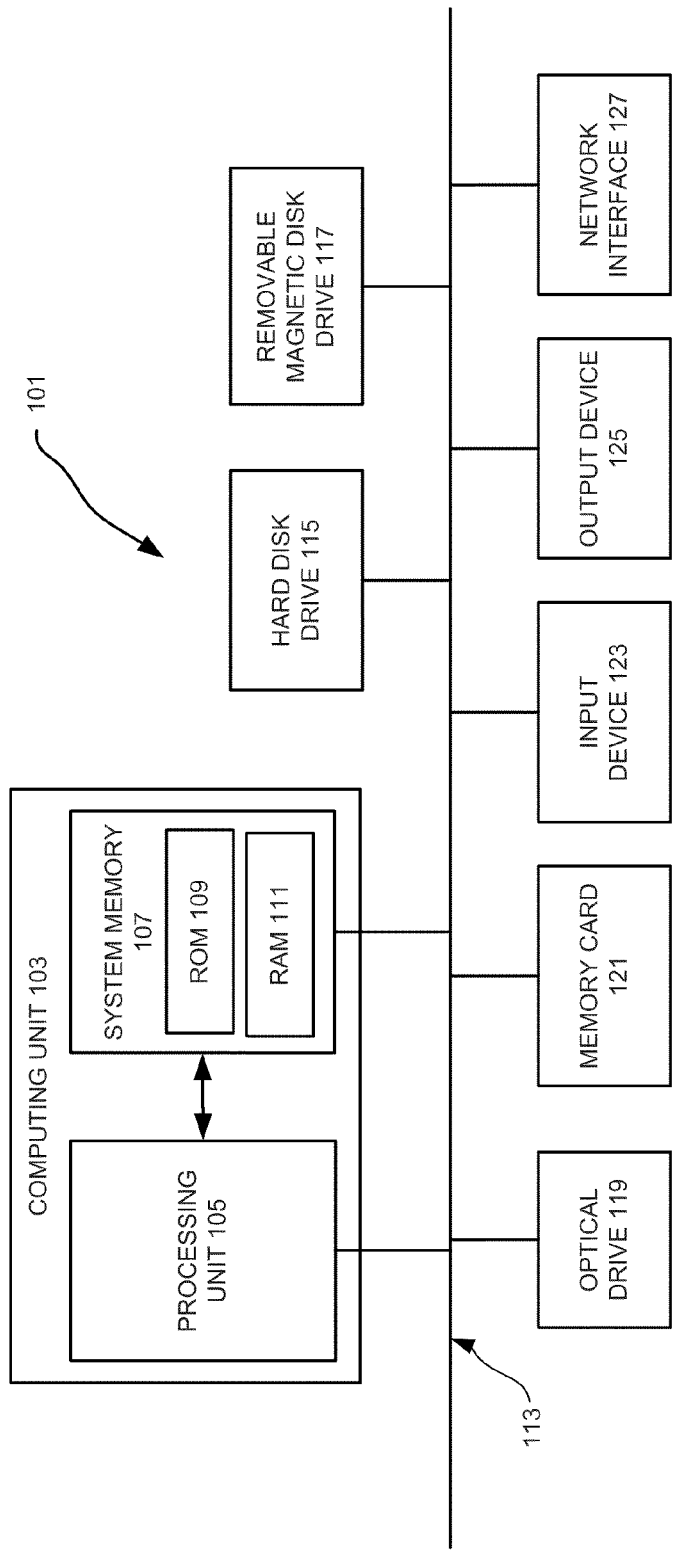
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Characterizing Switching Activity

Figure 2:
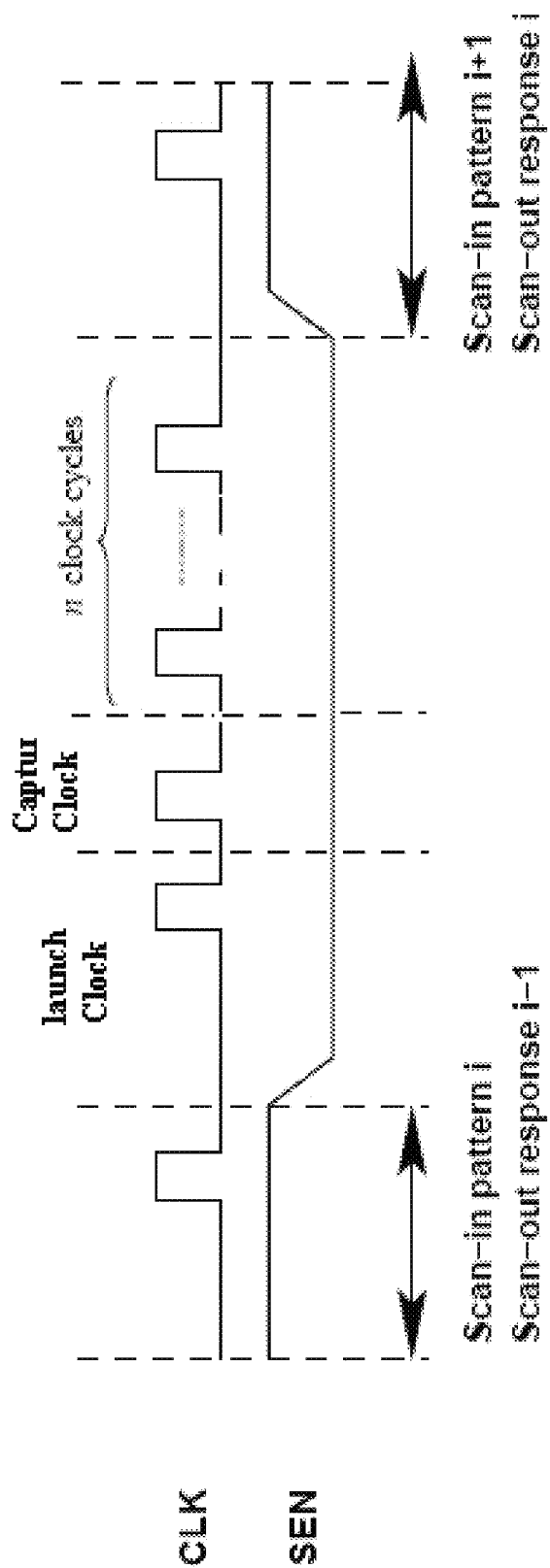
FIG. 2 illustrates a waveform diagram of a two-pattern launch off capture (LOC) test.

FIG. 2 illustrates a waveform diagram of a conventional two-pattern launch off capture (LOC) test for at speed testing. The signals CLK and SEN are clock and scan enable signals, respectively. The LOC test shifts in the first pattern (the initialization vector) with the scan enable line set at 1 (active). After the scan enable line is set at 0 (inactive), two fast capture pulses, called launch and capture pulses, respectively, are applied. In the two-pattern LOC test, the second pattern is the circuit response to the first pattern and is captured by the launch pulse. The replacement of the first pattern by the second pattern results in transitions in some of the scan cells. These transitions are propagated in the circuit and faults related to timing compliance such as transition delay faults (TDFs) may then be captured by the capture pulse. It should be noted that a conventional LOC test does not need the "n clock cycles" displayed in the figure. The "n clock cycles" are used for studying characteristics of the switching activity caused by scan tests and will be explained below.

During the application of LOC tests, circuit nodes switch states in both scan shift and capture cycles. As discussed in the background section, the switching activity caused by scan tests may be considerably higher than that in a normal operation state. High switching activity leads to high power and current demands, which may cause circuit response delays and damaging hot spots on the circuit. Weighted Switching Activity (WSA) may be used as a measure of power and supply current demand. The WSA of a gate is the number of state changes at the gate multiplied by (1+gate fanout). The WSA of the entire circuit is obtained by summing the WSA of all gates whose state switched:

$$WSA = \sum_{\forall gate} (1 + gatefanout).$$

Figure 3:
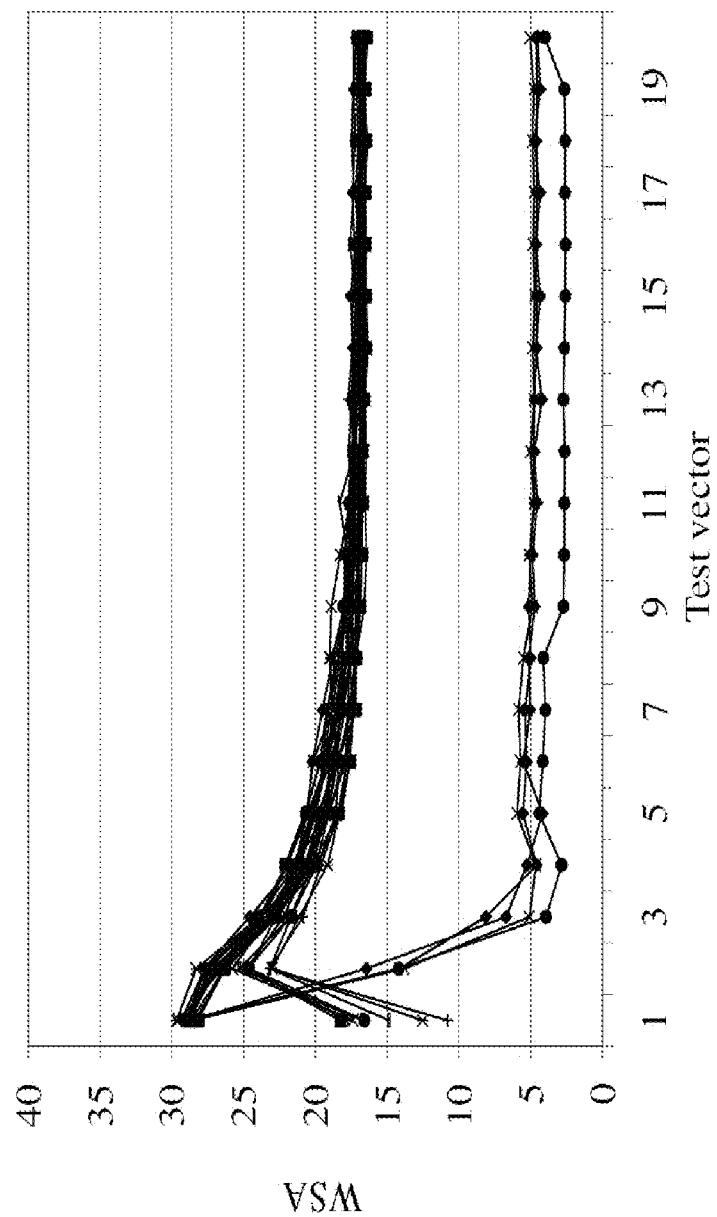
FIG. 3 shows how a circuit's weighted switching activity (WSA) evolves with clock cycles for a number of LOC test patterns when the scan enable line is set at 0.

FIG. 3 shows how a circuit's WSA evolves with clock cycles for a number of LOC test patterns when the scan enable line is set at 0. In the figure, WSA is given as a percentage of the maximum possible value of WSA which occurs if all gates in a CUT switch state simultaneously. The LOC test patterns are generated using the zero fill method. Similar results are obtained with the preferred fill and random fill methods. Three observations can be made from the figure: 1) the WSA reaches a steady state value which is typically much lower than the WSA during the first two capture cycles; 2) the steady state WSA value reached depends on the scanned in state; and 3) even when the WSA caused by the first (launch) capture cycle is low, the WSA of the second capture cycle could be much higher.

Filling Unspecified Bits With Functional Background Data

Based upon the foregoing, if unspecified bits in a test cube are filled with test responses (or scan cell values) obtained by simulating a test pattern for some cycles with scan enable at 0, the WSA of the resulting tests can be expected to be low and close to the steady state value determined during simulation. The reason is that the number of specified bits in test cubes is often small and hence the test vector obtained by filling the unspecified bits with steady state test responses will not cause switching activity of the CUT to deviate from the corresponding steady state significantly. A steady state is probably near a CUT's functional state. Therefore, test responses of a steady state are referred to as functional background data.

A simple example illustrates the method of filling unspecified bits with functional background data. Consider a test cube with $T_1=(0, X, 1, X, X, 0, X)$. First, the Xs are randomly replaced with 0s/1s to form a test pattern. After simulating the test pattern for several extra cycles, assume that the state obtained is $T_2=(0, 1, 0, 0, 1, 1, 0)$. Then the Xs in $T_1$ are filled by the corresponding values in $T_2$ to obtain a new test pattern $T=(0, 1, 1, 0, 1, 0, 0)$. Note that the test pattern T differs from $T_2$, the steady state pattern, in only 2 positions even though three cells in $T_1$ have specified values.

Extensive experiments show five cycles of simulating test cubes as described above may cause a CUT to reach steady states. Table 1 shows reduction in peak WSA during the first capture cycle for tests in two industrial circuits, C2020 and C2225, when the unspecified values in the test cubes are filled with values obtained after different numbers of cycles. The table shows that, after five cycles, most of the reduction in WSA has been achieved.

TABLE 1

| | % Peak WSA Reduction | | | | |
|---|---|---|---|---|---|
| Circuit | #cycle = 1 | #cycle = 3 | #cycle = 5 | #cycle = 10 | #cycle = 20 |
| C2020 | 25.18 | 30.05 | 31.28 | 32.00 | 32.45 |
| C2225 | 66.84 | 70.95 | 71.8 | 73.52 | 74.58 |

Figure 4:
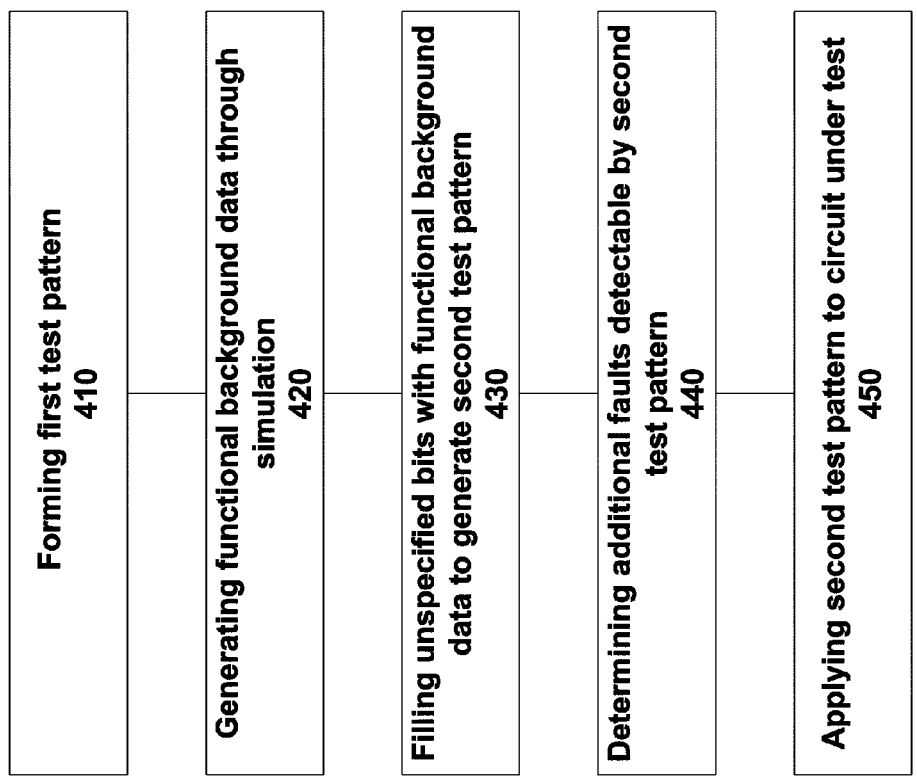
FIG. 4 shows a flow chart implementing the method of filling unspecified bits of a test cube with functional background data according to some embodiments of the invention.

FIG. 4 shows a flow chart implementing the method of filling unspecified bits with functional background data according to some embodiments of the invention. The flow starts with operation 410, which form the first test pattern by filling the unspecified bits of a test cube in according with a predefined method such as the random fill method. In operation 420, circuit simulation is performed for a number of clock cycles with the first test pattern to generate functional background data. The obtained scan cell values are used as functional background data to fill the unspecified bits of the test cube to generate the second test pattern in operation 430. In operation 440, the second test pattern is simulated to determine whether additional faults could be detected with the second test pattern. Finally, the second test pattern is applied to the circuit under test for testing purposes in operation 450. One or more operations in FIG. 4 may be executed in the computer-based operating environment described earlier. Also, as will be discussed in more detail below, one or more of these operations can be implemented using hardware circuits on the circuit-under-test.

It should be appreciated by a person of ordinary skill in the art that there are many ways to obtain functional background data. For example, the test pattern used for simulation to generate functional background data may be generated simply by filling the unspecified bits of the test cube with any of the fill methods such as random fill, zero fill, preferred fill and some combinations. Not only simulation, but actual operation of a circuit alternately or additionally could be applied to generate functional background data. Moreover, if test responses of a test pattern are known to be near steady state responses, they could be used as functional background data for a test cube which has no relationship with the test pattern.

Like the X-filling methods discussed in the background section, the method of filling unspecified bits of a test cube with functional background data according to various embodiments of the invention usually does not require changes to the conventional ATPG procedures. It may change just the way the unspecified values in test cubes are filled that is done after the test cubes are generated.

Circuits Embodiments in EDT Environment

Figure 5:
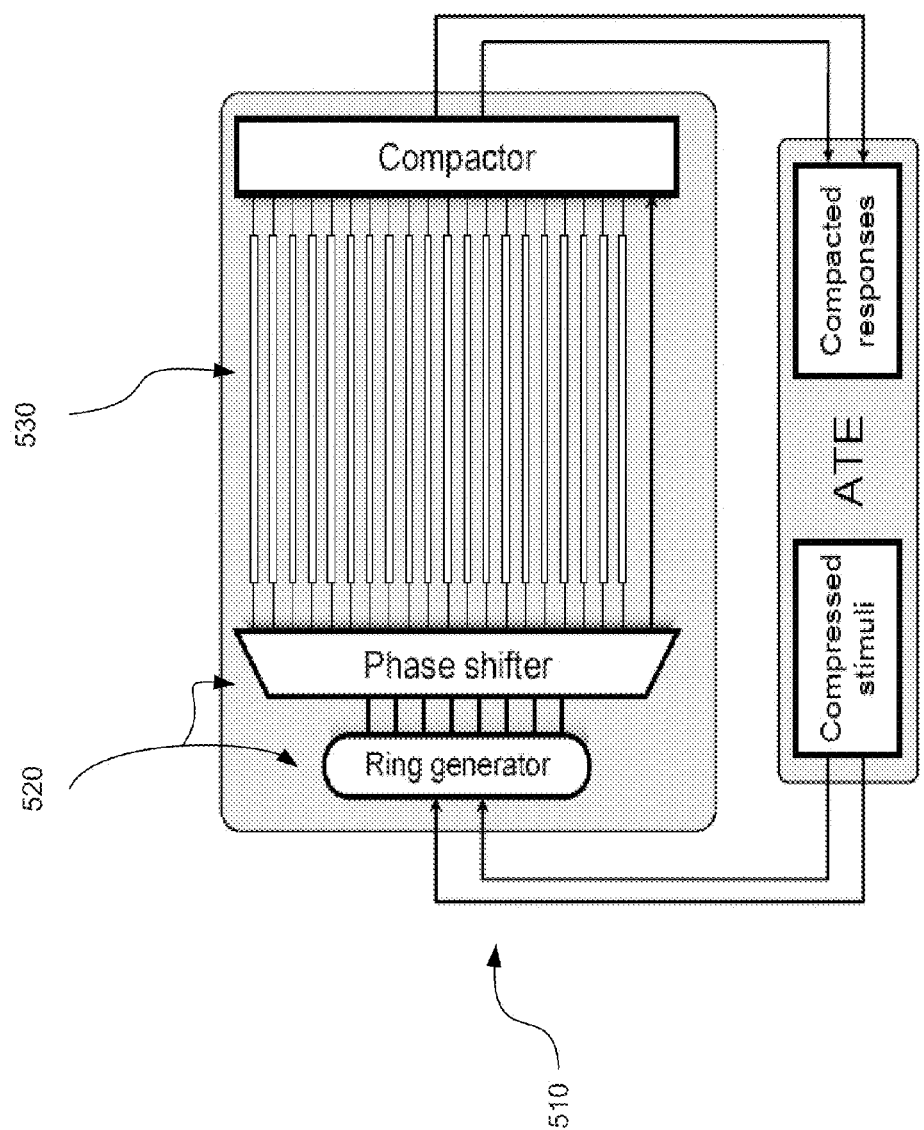
FIG. 5 shows an example of a test data decompressor and a compactor deployed in EDT environment.

FIG. 5 illustrates one example of a hardware arrangement that may be used to implement various embodiments of the invention in an EDT environment. As seen in this figure, a test data decompressor 520 may be deployed to provide test data to the circuit under test. It includes an n-bit ring generator and an associated phase shifter driving scan chains 530. Compressed test patterns are delivered to the decompressor through c external channels 510 in a continuous manner, i.e., a new c-bit vector is injected into the ring generator every scan shift cycle moving effectively the decompressor from one of its states to another.

The EDT pattern generation is deterministic. For a given testable fault, a pattern is generated to satisfy the ATPG constraints and to avoid bus contentions. Test cubes are inherently highly compressible because typically only 1% to 5% of the bits in a test pattern generated by an ATPG tool have specified values. Additionally, scan cells in many scan chains may not have any specified values at all. The percentage of scan chains that feature specified cell contents may also be deliberately limited to a small number such as 20%. While the pattern count may increase, there may be no fault coverage loss due to limiting the number of scan chains with specified bits. These characteristics may be used for various implementations of the invention.

Figure 6:
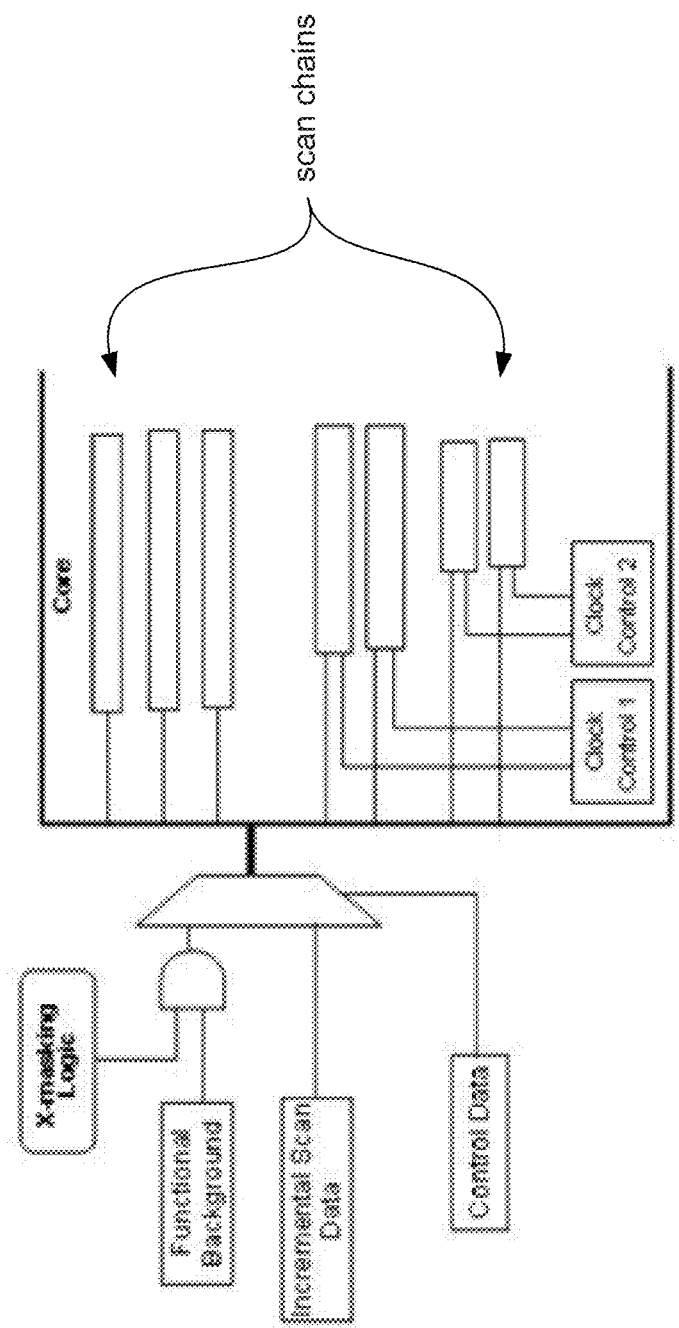
FIG. 6 illustrates a general scheme of filling unspecified bits of a test cube with functional background data for AC scan tests (i.e. at-speed scan test) in EDT environment according to some embodiments of the invention.

FIG. 6 illustrates a general scheme of filling unspecified bits of a test cube with functional background data for AC scan tests (i.e. at-speed scan test) in an EDT environment according to some embodiments of the invention. The figure highlights the input side, where the functional background data is combined with incremental scan data to construct actual test stimuli (i.e. filling unspecified bits of test cubes to generate test patterns). The functional background data may be generated or provided in many ways. The following are three examples: 1) provided from ATE (automated test equipment); 2) provided from on-chip memory; and 3) constructed from response data from a previous pattern.

Figure 7:
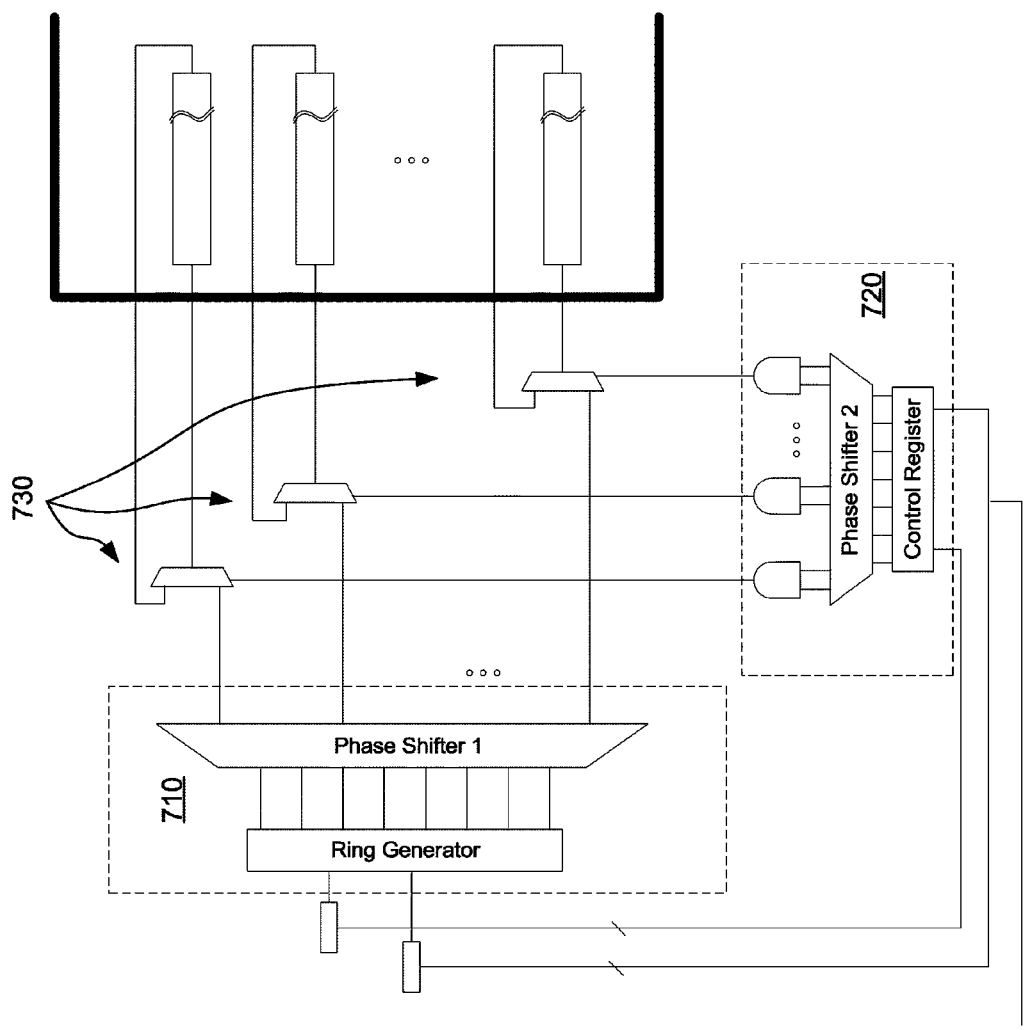
FIG. 7 illustrates a scheme of using responses of a previous pattern as functional background data to fill scan chains without specified values.

FIG. 7 illustrates a scheme of using responses of a previous pattern as functional background data to fill scan chains without specified values according to various implementations of the invention. The input channels provide test data to a decompressor 710 and control data to a control module 720, both in a compressed form. The decompressor 710 provides the incremental scan data corresponding to the specified bits that are needed for targeted faults. The control module 720 includes a control register, combinational XOR network, and some form of biasing logic. The control register stores the control data in a compressed form and when decompressed, they assure that a subset of chains with specified bits receive the stimuli from the decompressor while the remaining scan chains gets the re-circulated scan chain contents. As shown in the figure, the 2-input multiplexors at the inputs of scan chains select the stimuli either from the decompressor or from the scan chain outputs based on the control data. When re-circulating the scan chain outputs, the captured response from the previous vector is used as background for the current test vector. The fraction of scan chains which are driven directly by the decompressor can be changed by adding a biasing circuit, i.e., a group of AND gates driven by the XOR network. For example, if 2-input AND gates are used, then approximately 25% of scan chains are driven by the decompressor (approximately 25% of scan chains have specified bits), while the remaining are re-circulated. This percentage can be reduced even further by adding more inputs to the AND gates. For example, the third input reduces the percentage of scan chains driven by the decompressor down to 12.5%, while the fraction of scan chains getting the scan chains output value increases accordingly. It must be noted that the control data in FIG. 6 stay constant through out the entire test pattern.

Figure 8:
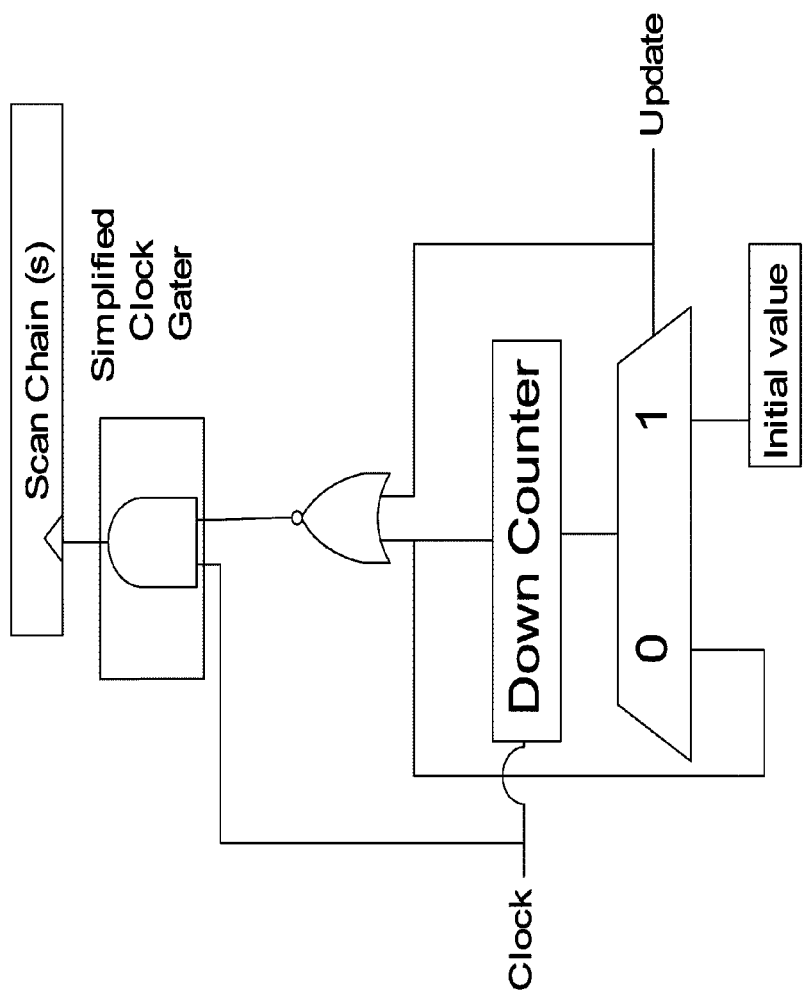
FIG. 8 shows an example of a clock gating module for a circuit with unbalanced scan chains.

The scheme presented in FIG. 7 assumes that all scan chains are balanced. For a design with unbalanced scan chains, chains with the same sizes can be grouped together to form a set. Apart from the longest scan chains, each one of the smaller sets of scan chains require a clock gating circuitry for the shift clocks to allow re-circulation of the captured responses to their respective inputs. An implementation of a clock gating module is shown in FIG. 8. It includes a down counter that is loaded with an initial value. The initial value is dependent on the offset with respect to the longest scan chains. When the down counter counts down, the clock gating module blocks the clock thereby shutting down the scan chains during those cycles. Once the counter gets to zero, the clock gating module opens and the scan chains start loading data either from the decompressor or from re-circulated scan responses.

In FIG. 7, not all unspecified bits of a test cube are filled with functional background data since the scheme only separates scan chains into two groups, one with and one without specified bits. Even though the scan chain number is small, each of the scan chains in the former group still has a significant number of unspecified bits that are not filled with functional background data according the scheme presented in FIG. 7. This is because for each scan chain with specified bit(s), the majority of its scan cells may have unspecified values.

Figure 9:
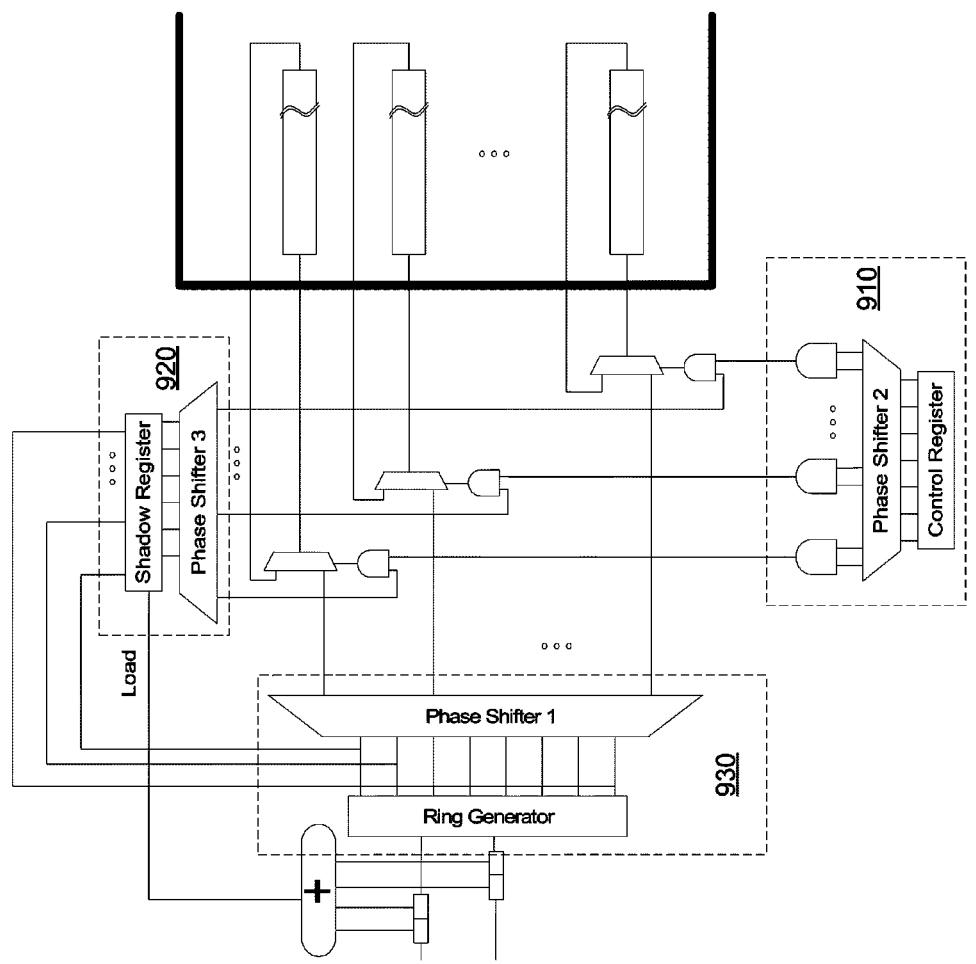
FIG. 9 illustrates a scheme of filling unspecified bits with functional background data for scan chains with and without specified bits according to some embodiments of the invention.

FIG. 9 presents a scheme of filling unspecified bits with functional background data for scan chains with and without specified bits according to some embodiments of the invention. The control module in FIG. 9 has two sub-modules. Sub-module 910 is the same as control module 720 in FIG. 7. Sub-module 920, including a shadow register and a phase shifter (phase shifter 3) are used to receive and deliver a control pattern which determine whether a given scan chain receives data from decompressor 930 or from the scan chain output.

Figures 10A, 10B:
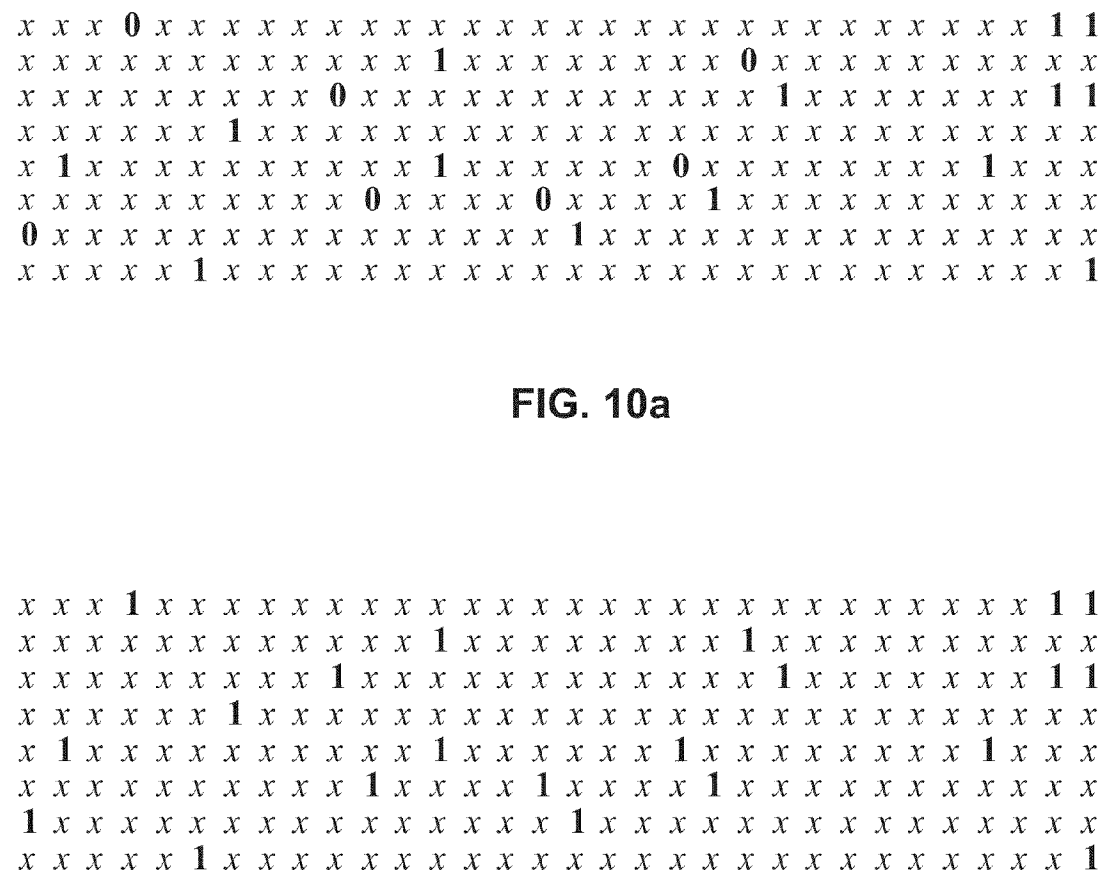

As an example, consider a portion of a test cube shown in FIG. 10a (it shows only scan chains with specified bits). The corresponding control pattern showed in FIG. 10b assumes, according to some embodiments of the invention, the value of 1 every time the test cube features a specified value. It can be efficiently encoded by assuming that the decompressor outputs are sustained for more than a single clock cycle to deliver the identical test data to the AND gate of the multiplexer select inputs for a number of shift cycles. Using the control pattern, in addition to scan chains loading data from the scan chains output, one can bring some scan cells in those chains with specified bits to re-circulating mode, thus reducing the total switching activity even further.

The shadow register in sub-module 920 is used to keep outputs of the ring generator in decompressor 930 unchanged. It is placed between the ring generator and the phase shifter 3. The shadow register captures and saves, for a number of cycles, a desired state of the ring generator, while the generator itself keeps advancing to the next states in order to encode incoming specified bits. Since in most cases single output of the XOR network produces 0 with probability 0.5, thus approximately half of the scan chains with specified value get the value of the functional background in every cycle. Note that the ring generator is reused as its encoding capabilities are sufficient to handle low control pattern fill rates.

There are different ways to encode the information required for updating the shadow register. In FIG. 9, small buffers placed in parallel with the decompressor inputs drive an XOR tree which computes a parity of input variables, including not only data currently entering the ring generator, but also those used in previous cycles. If the parity of the inputs is odd, then the shadow register is reloaded with the current content of ring generator before new seed variables enter the generator (and it reaches its next state). Otherwise, the contents of the shadow register remain unchanged. Reusing the same control data across multiple clock cycles reduces the stress on the encoding capacity needs for the ring generator, as well as, reduces the control data volume needed to be stored on an ATE.

Figure 11:
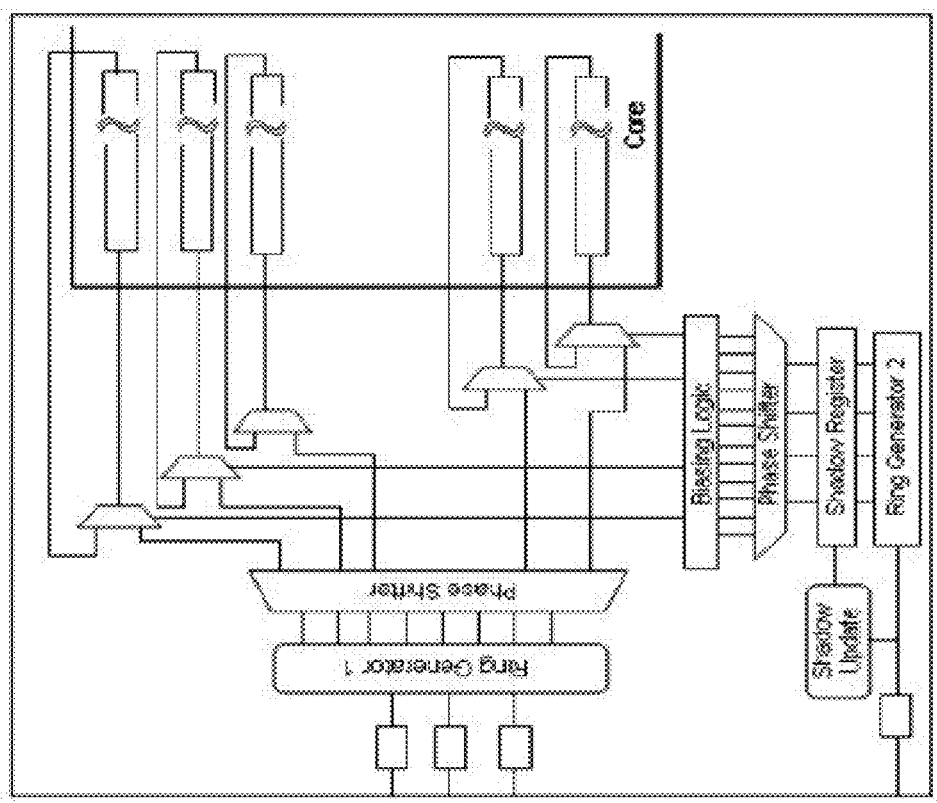
FIG. 11 illustrates another scheme of filling unspecified bits with functional background data for scan chains with and without specified bits.

FIG. 11 illustrates another scheme of filling unspecified bits with functional background data for scan chains with and without specified bits. The only one control module includes a ring generator (ring generator 2), a shadow register, a phase shifter and a biasing logic circuit. Since a new set of variables are pumped into ring generator 2 in every cycle, a large number of scan chain control values can be encoded on a per cycle basis.

Figure 12:
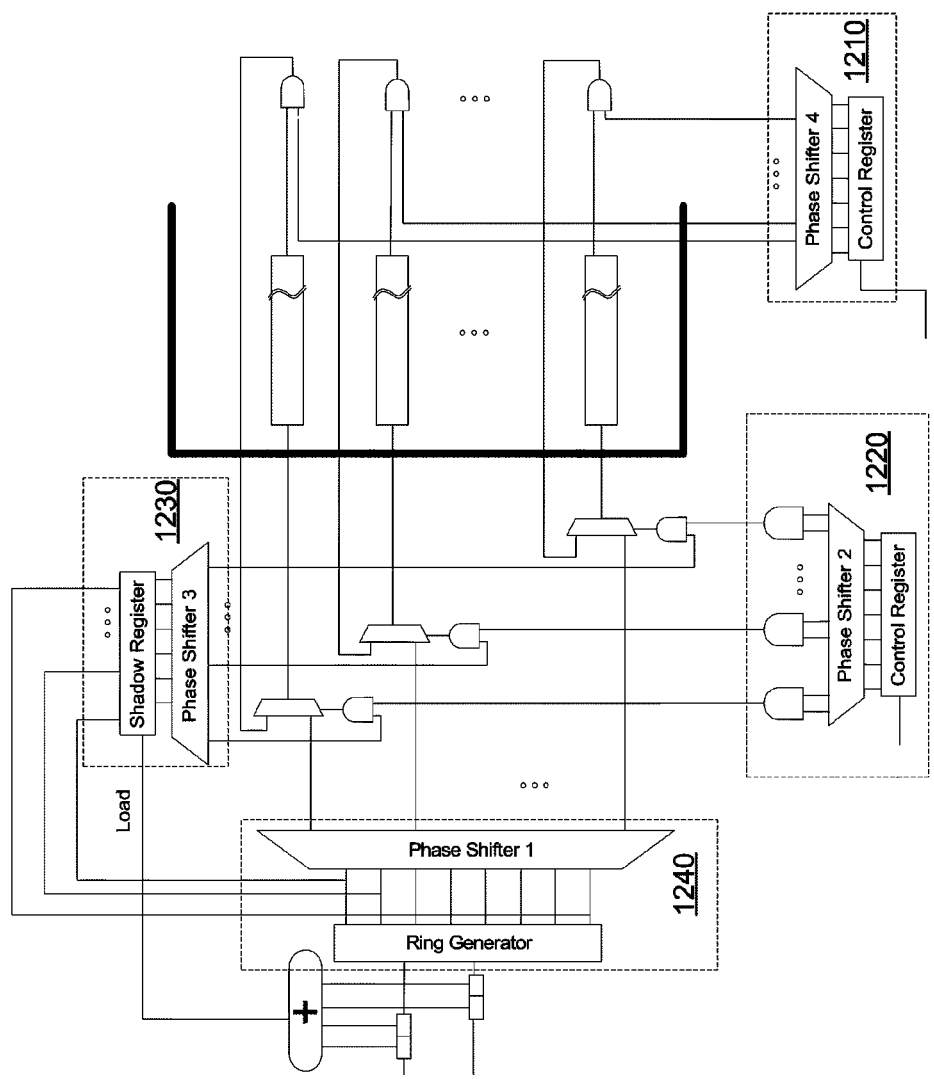
FIG. 12 illustrates a scheme of X-masking according to some embodiments of the invention in which the X-masking circuit is separated from the other two control blocks which determine whether a scan cell receives a value from the decompressor or re-circulates its current content.

When using captured values in the scan chains as the functional background data for subsequent patterns, one of the requirements is to ensure that the unknowns (X-states) be masked and known values drive the inputs of scan chains. In the scheme presented in FIG. 7, the scan chain control data are encoded along with the seed for the specified bit locations. The control data can also include the need for masking X's. FIG. 12 shows another scheme of X-masking according to some embodiments of the invention. In FIG. 12, two control sub-modules 1220 and 1230 determine whether a scan cell receives a value from the decompressor 1240 or re-circulates its current content. X-masking circuit 1210, including a control register and a phase shifter (phase shifter 4), can blocks any Xs that are captured in the test responses. This may serve two purposes—(a) the circuit blocks any Xs from propagating to the output of the compactor thereby enabling the usage of a temporal compactor such as a MISR at the output, and (b) the re-circulated values from the scan chains will have no Xs and therefore can be used to drive the scan chains directly.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method of filling unspecified bits of a test cube, comprising:
   receiving a test cube for testing a circuit;
   generating functional background data for the circuit, the functional background data being scan cell values observed when switching activity of the circuit reaches or substantially reaches a steady state;
   filling unspecified bits of the test cube with the functional background data to form a test pattern; and
   storing the test pattern in a processor-readable medium or testing the circuit with the test pattern.

2. The method recited in claim 1, wherein the operation of receiving a test cube comprises:
   selecting a test cube for testing a circuit;
   compressing the test cube to generate a compressed test cube; and
   loading the compressed test cube to a decompressor.

3. The method recited in claim 1, wherein the operation of receiving a test cube comprises:
   generating a test cube for detecting one or more faults.

4. The method recited in claim 1, wherein the operation of generating functional background data comprises:
   generating test responses by applying a second test pattern for a plurality of clock cycles; and
   generating functional background data based on the test responses.

5. The method recited in claim 4, wherein unspecified bits of the second test pattern are filled using a random fill method.

6. The method recited in claim 4, wherein unspecified bits of the second test pattern are filled using a method combining a random filling method with a preferred fill method.

7. The method recited in claim 1; further comprising:
   performing fault simulation to determine whether additional faults could be detected by the test pattern.

8. The method recited in claim 1, wherein the functional background data are generated by simulation of the circuit.

9. The method recited in claim 1, wherein the functional background data are generated by operation of the circuit.

10. A non-transitory processor-readable medium storing processor-executable instructions for causing one or more processors to perform a method of filling unspecified bits of a test cube, the method comprising:
receiving a test cube for testing a circuit;
generating functional background data for the circuit, the functional background data being scan cell values observed when switching activity of the circuit reaches or substantially reaches a steady state;
filling unspecified bits of the test cube with the functional background data to form a test pattern; and
storing the test pattern in a processor-readable medium or testing the circuit with the test pattern.

11. The non-transitory processor-readable medium recited in claim 10, wherein the operation of generating functional background data comprises:
generating test responses by applying a second test pattern for a plurality of clock cycles; and
generating functional background data based on the test responses.

12. The non-transitory processor-readable medium recited in claim 11, wherein the second test pattern is the derived by filling the unspecified bits of the test cube with a predefined method.

13. A system comprising one or more processors, the one or more processors programmed to perform a method of filling unspecified bits of a test cube, the method comprising:
receiving a test cube for testing a circuit;
generating functional background data for the circuit, the functional background data being scan cell values observed when switching activity of the circuit reaches or substantially reaches a steady state;
filling unspecified bits of the test cube with the functional background data to form a test pattern; and
storing the test pattern in a processor-readable medium or testing the circuit with the test pattern.

14. The system recited in claim 13, wherein the operation of generating functional background data comprises:
generating test responses by applying a second test pattern for a plurality of clock cycles; and
generating functional background data based on the test responses.

15. A circuit for scan testing in a compression environment, comprising:
a decompressor that receives and decompresses a compressed test cube to form a test pattern; and
a control module that replaces a plurality of don't-care bits of the test pattern with functional background data, the functional background data being test responses generated by the circuit.

16. The circuit recited in claim 15, wherein the plurality of don't-care bits are bits of the test pattern for scan chains without a specified bit.

17. The circuit recited in claim 15, wherein the plurality of don't-care bits are unspecified bits of the compressed test cube.

18. The circuit recited in claim 15, wherein the functional background data are test responses of a prior test pattern.

19. The circuit recited in claim 15, wherein the decompressor comprises:
a ring generator that receives a compressed test cube; and
a first phase shifter connected to the ring generator.

20. The circuit recited in claim 19, wherein the control module comprises:
a control register that receives and stores control data;
a second phase shifter driven by the control register; and
a set of AND gates driven by the second phase shifter.

21. The circuit recited in claim 20, wherein the control module further comprises a clock gating sub-module for unbalanced scan chains.

22. The circuit recited in claim 20, wherein the control module further comprises:
a shadow register with inputs connected to outputs of the ring generator;
an XOR gate that computes a parity of input data of the ring generator, the input data including not only data currently entering the ring generator but also those used in previous cycles, an output of the XOR gate controlling when to reload the shadow register; and
a third phase shifter driven by the shadow register.

23. The circuit recited in claim 20, wherein the control module further comprises an X-masking sub-module.

* * * * *